(12) United States Patent
Pril et al.

(10) Patent No.: US 10,768,025 B2
(45) Date of Patent: Sep. 8, 2020

(54) ENCODER, POSITION MEASUREMENT SYSTEM AND LITHOGRAPHIC APPARATUS INVOLVING AN ENCLOSING DEVICE

(71) Applicant: ASML NETHERLANDS B.V., Veldhoven (NL)

(72) Inventors: Wouter Onno Pril, Geldrop (NL); Jan Peter Baartman, Eindhoven (NL); Allard Eelco Kooiker, Waalre (NL); Suzanne Johanna Antonetta Geertruda Cosijns, Casteren (NL); Bryan Tong-Minh, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/524,263

(22) PCT Filed: Oct. 22, 2015

(86) PCT No.: PCT/EP2015/074515
§ 371 (c)(1),
(2) Date: May 3, 2017

(87) PCT Pub. No.: WO2016/083039
PCT Pub. Date: Jun. 2, 2016

(65) Prior Publication Data
US 2017/0343390 A1    Nov. 30, 2017

(30) Foreign Application Priority Data

Nov. 28, 2014  (EP) .................................... 14195466
Feb. 17, 2015  (EP) .................................... 15155387

(51) Int. Cl.
*G01D 5/38*      (2006.01)
*G03F 7/20*      (2006.01)
(Continued)

(52) U.S. Cl.
CPC ................. *G01D 5/38* (2013.01); *G01B 9/02* (2013.01); *G01B 11/02* (2013.01);
(Continued)

(58) Field of Classification Search
CPC .... G05B 2219/37177; B65H 2553/512; B65H 2553/51; G01D 5/34707; G01D 5/34769;
(Continued)

(56) References Cited

U.S. PATENT DOCUMENTS 5,036,192 A * 7/1991 Ishizuka .................. G01D 5/38
250/231.16
5,469,260 A   11/1995 Takagi et al.
(Continued)

FOREIGN PATENT DOCUMENTS

CN    102197286    9/2011
EP    1 528 367    5/2005
(Continued)

OTHER PUBLICATIONS

International Search Report and Written Opinion dated Feb. 10, 2016 in corresponding International Patent Application No. PCT/EP2015/074515.
(Continued)

*Primary Examiner* — Michael P LaPage
(74) *Attorney, Agent, or Firm* — Pillsbury Winthrop Shaw Pittman LLP

(57) ABSTRACT

An encoder includes an optical component and an enclosing device having a first surface portion and a second surface portion. The first surface portion is arranged to receive from an ambient environment a first radiation beam. The second surface portion is arranged to receive from the ambient environment a second radiation beam. The optical component is arranged to combine the first and second radiation beams. The enclosing device is arranged to propagate the
(Continued)

first radiation beam along a first path. The first path is between the first surface portion and the optical component. The enclosing device is arranged to propagate the second radiation beam along a second path. The second path is between the second surface portion and the optical component. The enclosing device is arranged to enclose a space, so as to isolate the first path and the second path from the ambient environment.

21 Claims, 4 Drawing Sheets

(51) Int. Cl.
*G01B 9/02* (2006.01)
*G01B 11/02* (2006.01)

(52) U.S. Cl.
CPC ...... *G03F 7/70725* (2013.01); *G03F 7/70775* (2013.01); *G03F 7/70933* (2013.01)

(58) Field of Classification Search
CPC ........... G01D 5/34746; G01D 5/34761; G01D 5/34715; G01D 5/347
See application file for complete search history.

(56) References Cited

U.S. PATENT DOCUMENTS

| | | | |
|---|---|---|---|
| 7,573,581 | B2 | 8/2009 | Holzapfel et al. |
| 8,222,594 | B2 | 7/2012 | Makinouchi et al. |
| 2005/0122589 | A1 | 6/2005 | Bakker |
| 2007/0058173 | A1 | 3/2007 | Holzapfel et al. |
| 2011/0080567 | A1 | 4/2011 | Hoekerd et al. |
| 2011/0192964 | A1 | 8/2011 | Makinouchi et al. |
| 2011/0272565 | A1* | 11/2011 | Makinouchi ....... G01D 5/34746 250/231.1 |
| 2011/0304839 | A1* | 12/2011 | Beerens .............. G03F 7/70775 355/72 |
| 2013/0128255 | A1* | 5/2013 | Liu ........................ G01D 5/34 355/72 |
| 2013/0277540 | A1* | 10/2013 | Tobiason ............... G01D 5/268 250/227.11 |
| 2015/0177027 | A1* | 6/2015 | Kato .................. G01D 5/34707 250/231.1 |
| 2015/0227060 | A1 | 8/2015 | Beerens et al. |

FOREIGN PATENT DOCUMENTS

| | | |
|---|---|---|
| EP | 2 177 867 | 4/2010 |
| JP | 2005-142569 | 6/2005 |
| JP | 2005-283487 | 10/2005 |
| JP | 2008-070363 | 3/2008 |
| JP | 2011-082511 | 4/2011 |
| JP | 2011-257394 | 12/2011 |
| JP | 2013-40834 | 2/2013 |
| JP | 2013-040834 | 2/2013 |
| JP | 2014-190896 | 10/2014 |
| TW | 200923330 | 6/2009 |
| WO | 96/18868 | 6/1996 |
| WO | WO 96/18868 | 6/1996 |
| WO | 2005-027206 | 3/2005 |
| WO | 2010047100 | 4/2010 |
| WO | 2014/044477 | 3/2014 |
| WO | 2014-044670 | 3/2014 |
| WO | WO 2014/044477 | 3/2014 |

OTHER PUBLICATIONS

Chinese Office Action dated Feb. 24, 2018 in corresponding Chinese Patent Application No. 201580065230.9.
Japanese Office Action issued in corresponding Japanese Patent Application No. 2017-524410, dated Jun. 26, 2018.

* cited by examiner

ENCODER, POSITION MEASUREMENT SYSTEM AND LITHOGRAPHIC APPARATUS INVOLVING AN ENCLOSING DEVICE

CROSS-REFERENCE TO RELATED APPLICATIONS

This application is the U.S. national phase entry of PCT patent application no. PCT/EP2015/074515, which was filed on Oct. 22, 2015, which claims the benefit of priority of European patent application no. 14195466.9, which was filed on Nov. 28, 2014, and European patent application no. 15155387.2, which was filed on Feb. 17, 2015, and each which application is incorporated herein in its entirety by reference.

FIELD OF THE INVENTION

The invention relates to an encoder, a position measurement system and a lithographic apparatus.

BACKGROUND ART

A lithographic apparatus is an apparatus that can be used in the manufacture of integrated circuits (ICs). In that instance, a patterning device, which is alternatively referred to as a mask or a reticle, may be used to generate a circuit pattern to be formed on an individual layer of the IC. This pattern can be transferred by a radiation beam via a projection system onto a target portion on a substrate, such as a silicon wafer. Transfer of the pattern is typically performed via imaging onto a layer of radiation-sensitive material provided on the substrate. The location on which the radiation beam is incident on the target portion is referred to as the exposure location.

The cross-section of the radiation beam is typically much smaller than the surface of the substrate. So in order to expose all the target portions on the surface of the substrate, the substrate is moved relative to the projection system. The lithographic apparatus has a stage system to move the substrate relative to the projection system. The stage system is able to move the substrate in such a way that the target portions are placed consecutively in the path of the radiation beam.

To place each of the target portions in the path of the radiation beam correctly, the lithographic apparatus is provided with a position measurement system. The position measurement system measures a position of the stage system. The position measurement system comprises an encoder and a scale. The scale has a grating surface. The encoder is arranged to receive radiation beams from the grating surface of the scale. The encoder is able to detect a change in a phase of the radiation beams when the grating surface moves relative to the encoder. In dependence of the phase, the encoder is able to generate a position signal representative of the position of the grating surface relative to the encoder.

SUMMARY OF THE INVENTION

To allow the encoder to move relative to the scale, there is a distance between the encoder and the scale. The radiation beams travel across this distance through an ambient environment, for example ambient air. However, the ambient air may be disturbed by a temperature change and/or a pressure change, which may occur especially when the encoder and the scale move relative to each other at a high speed. The temperature change and/or the pressure change may influence the refractive index of the medium through which the radiation beams travel. A change in the refractive index causes a change in the position signal provided by the encoder and as a result, creates a measurement error. The measurement error is increased even more, when one of the radiation beams travels a longer distance through the ambient environment than the other radiation beam. In this case, the changes in temperature and pressure will influence one radiation beam more than the other radiation beam.

It is an objective of the invention to improve the accuracy of the encoder.

In this document, the term "path length" is used to indicate the spatial length of a radiation beam between two locations. For example, when two locations are 10 cm apart, a radiation beam between the two locations has a path length of 10 cm. The term "optical path length" is used to indicate the optical length of a radiation beam, i.e., the length multiplied by the refractive index of the medium through which the radiation beam propagates. For example, when two locations are 10 cm apart and the space between the two locations is completely filled with a glass having a refractive index of 1.5, the optical path length of a radiation beam between two locations is 10 cm multiplied by 1.5. In this example, the optical path length is thus 15 cm.

According to an embodiment of the invention, there is provided an encoder comprising an optical component and an enclosing device having a receiving surface, a first medium and a second medium. The receiving surface is arranged to receive from an ambient environment a first radiation beam and a second radiation beam. The optical component is arranged to combine the first radiation beam and the second radiation beam. The enclosing device is arranged to propagate the first radiation beam along a first path and the second radiation beam along a second path. The first path and the second path are from the receiving surface to the optical component. The enclosing device is arranged to isolate the first path and the second path from the ambient environment. The first path is at least partly through the first medium. The second path is at least partly through the second medium. A path length of the first path through the second medium is different from a path length of the second path through the second medium.

According to another embodiment of the invention, there is provided a position measurement system comprising the encoder mentioned above.

According to another embodiment of the invention, there is provided a lithographic apparatus comprising the position measurement system mentioned above.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
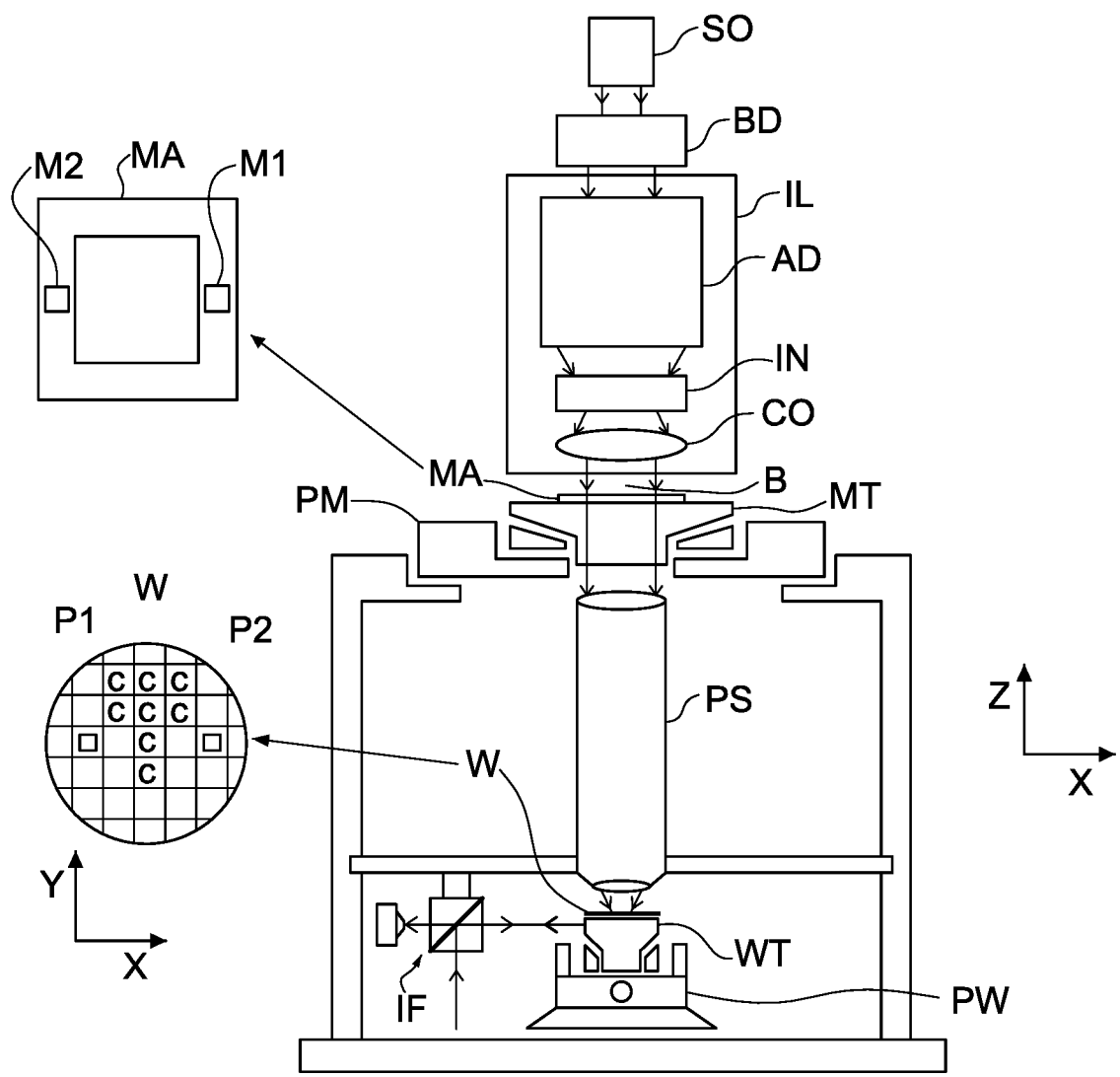
FIG. 1 depicts a lithographic apparatus according to the invention.

FIG. 1 schematically depicts a lithographic apparatus with a position measurement system according to the invention.

The apparatus may comprise an illumination system IL, a support structure MT, a substrate table WT and a projection system PS.

The illumination system IL is configured to condition a radiation beam B. The illumination system IL may include various types of optical components, such as refractive, reflective, magnetic, electromagnetic, electrostatic or other types of optical components, or any combination thereof, for directing, shaping, or controlling radiation.

The illumination system IL receives a radiation beam from a radiation source SO. The radiation source SO and the lithographic apparatus may be separate entities, for example when the radiation source SO is an excimer laser. In such cases, the radiation source SO is not considered to form part of the lithographic apparatus and the radiation beam B is passed from the radiation source SO to the illumination system IL with the aid of a beam delivery system BD comprising, for example, suitable directing mirrors and/or a beam expander. In other cases the radiation source SO may be an integral part of the lithographic apparatus, for example when the radiation source SO is a mercury lamp. The radiation source SO and the illumination system IL, together with the beam delivery system BD if required, may be referred to as a radiation system.

The illumination system IL may comprise an adjuster AD for adjusting the angular intensity distribution of the radiation beam. In addition, the illumination system IL may comprise various other components, such as an integrator IN and a condenser CO. The illumination system IL may be used to condition the radiation beam B, to have a desired uniformity and intensity distribution in its cross section.

The term "radiation beam B" used herein encompasses all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The support structure (e.g. a mask table) MT is for supporting a patterning device (e.g. a mask or reticle) MA. The support structure MT is connected to a first stage system PM configured to accurately position the patterning device MA in accordance with certain parameters.

The support structure MT supports, i.e. bears the weight of the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device MA" used herein should be broadly interpreted as referring to any device that can be used to impart a radiation beam B with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam B will correspond to a particular functional layer in a device being created in the target portion C, such as an integrated circuit.

The patterning device MA may be transmissive or reflective. Examples of a patterning device MA include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix. As here depicted, the apparatus is of a transmissive type, which employs a transmissive mask.

The substrate table WT, e.g. a wafer table, is for holding a substrate W, e.g. a resist coated wafer. The substrate table WT is connected to a second stage system PW configured to accurately position the substrate W in accordance with certain parameters.

The projection system PS is configured to project a pattern imparted to the radiation beam B by patterning device MA onto a target portion C of the substrate W.

The term "projection system PS" used herein should be broadly interpreted as encompassing any type of projection system PS, including refractive, reflective, magnetic, electromagnetic and electrostatic optical systems, or any combination thereof, as appropriate for the exposure radiation being used, or for other factors such as the use of an immersion liquid or the use of a vacuum.

The radiation beam B is incident on the patterning device MA and is patterned by the patterning device MA. Having traversed the patterning device MA, the radiation beam B passes through the projection system PS which focuses the radiation beam B onto a target portion C of the substrate W. The location on the substrate W on which the radiation beam B is focused is referred to as the exposure location. With the aid of the second positioning system PW and position measurement system IF (e.g. comprising an interferometric device, encoder or capacitive sensor), the substrate table WT can be moved accurately, e.g., so as to position different target portions C in the path of the radiation beam B. Similarly, the first stage system PM and another position measurement system IF (which is not depicted in FIG. 1) can be used to accurately position the patterning device MA with respect to the path of the radiation beam B. In general, movement of the support structure MT may be realized with the aid of a long-stroke module and a short-stroke module. The long-stroke module provides coarse positioning of the short-stroke module relative to the projection system PS over a long range. The short-stroke module provides fine positioning of the patterning device MA relative to the long-stroke module over a small range. Similarly, movement of the substrate table WT may be realized using a long-stroke module and a short-stroke module, which form part of the second stage system PW. In the case of a stepper (as opposed to a scanner) the support structure MT may be connected to a short-stroke actuator only, or may be fixed.

Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C. Similarly, in situations in which more than one die is provided on the patterning device MA, the mask alignment marks M1, M2 may be located between the dies.

The lithographic apparatus may be of a type having two or more substrate tables WT and/or two or more support structures MT. In addition to the at least one substrate table WT, the lithographic apparatus may comprise a measurement table, which is arranged to perform measurements but is not arranged to hold a substrate W.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

The depicted lithographic apparatus could be used in at least one of the following three modes:

In the first mode, the so-called step mode, the support structure MT and the substrate table WT are kept essentially stationary, while an entire pattern imparted to the radiation beam B is projected onto a target portion C at one time. The substrate table WT is then shifted in the X and/or Y direction by the second positioning system PW so that a different target portion C can be exposed.

In the second mode, the so-called scan mode, the support structure MT and the substrate table WT are scanned synchronously while a pattern imparted to the radiation beam B is projected onto a target portion C. The velocity and direction of the substrate table WT relative to the support structure MT may be determined by the (de-)magnification and image reversal characteristics of the projection system PS.

In the third mode, the support structure MT is kept essentially stationary holding a programmable patterning device MA. The substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device MA, such as a programmable mirror array of a type as referred to above.

Combinations and/or variations on the above described modes of use or entirely different modes of use may also be employed.

The position measurement system IF may comprise an encoder. An encoder is known from for example, United States patent application US2007/0058173A1, filed on Sep. 7, 2006, incorporated by reference. In general, such a known encoder has the following characteristics. The known encoder may receive a primary radiation beam and a secondary radiation beam. Both the primary radiation beam as well as the secondary radiation beam originates from the same radiation beam, i.e., the original radiation beam. At least one of the primary radiation beam and the secondary radiation beam is created by diffracting the original radiation beam with a grating. If both the primary radiation beam and the secondary radiation beam are created by diffracting the original radiation beam, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The known encoder optically combines the primary radiation beam and the secondary radiation beam into a combined radiation beam. A sensor determines a phase or phase difference of the combined radiation beam. The sensor generates a signal based on the phase or phase difference. The signal is representative of a position of the encoder relative to the grating.

Figure 2:
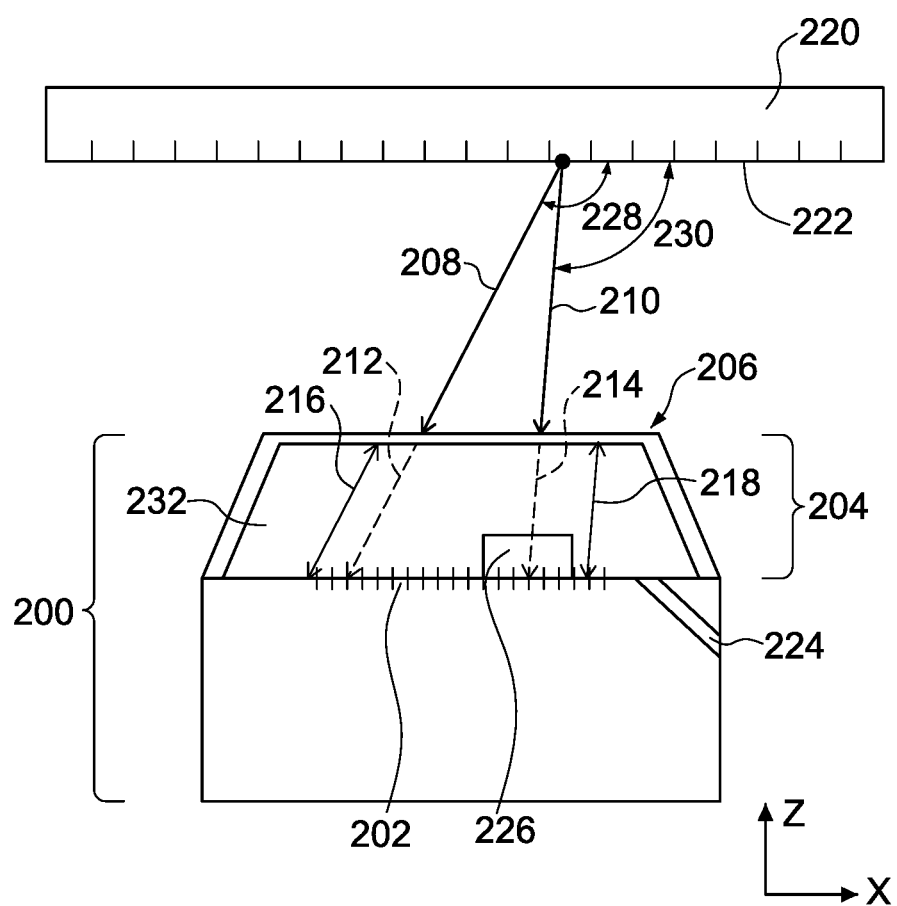
FIG. 2 depicts an encoder according to a first embodiment of the invention.

FIG. 2 depicts an encoder according to a first embodiment of the invention. The position measurement system IF has an encoder 200. The encoder 200 has a reference grating 202 and an enclosing device 204. The enclosing device 204 has a receiving surface 206 for receiving a first radiation beam 208 and a second radiation beam 210. The receiving surface 206 has a first surface portion to receive the first radiation beam 208. The receiving surface 206 has a second surface portion to receive the second radiation beam 210. The first radiation beam 208 and the second radiation beam 210 may respectively be the primary radiation beam and the secondary radiation beam described above. The first surface portion and the second surface portion are at least partly transparent for the first radiation beam 208 and the second radiation beam 210. Via the receiving surface 206, the first radiation beam 208 and the second radiation beam 210 are able to enter the enclosing device 204. The enclosing device 204 is arranged to propagate the first radiation beam 208 along a first path 212 from the first surface portion to the reference grating 202. The enclosing device 204 is arranged to propagate the second radiation beam 210 along a second path 214 from the second surface portion to the reference grating 202. The first path 212 is different from the second path 214. The enclosing device 204 has a first path length 216 along the first path 212. The enclosing device 204 has a second path length 218 along the second path 214. The first path length 216 is different from the second path length 218. In the example of FIG. 2, the first path length 216 is larger than the second path length 218.

The first path 212 may have a first optical path length. The second path 218 may have a second optical path length different from the first optical path length. For example, the second optical path length is larger than the first optical path length. By creating a difference between the first optical path length and the second optical path length, the total optical path length of the first radiation beam and the total optical path length of the second radiation beam may be made equal to each other to minimize any negative effect of fluctuations of the radiation source providing the first radiation beam and the second radiation beam. The total optical path length of the first radiation beam and the total optical path length of the second radiation beam may comprise any part between the radiation source and the sensor receiving the combined first radiation beam and second radiation beam.

The first radiation beam 208 and the second radiation beam 210 originate from a grating surface 222 of a scale 220. The grating surface 222 has a pattern to diffract at least one radiation beam so as to create the first radiation beam 208 and the second radiation beam 210. The first radiation beam 208 and the second radiation beam 210 propagate from the grating surface 222 via the enclosing device 204 to the reference grating 202. The reference grating 202 is arranged to diffract, transmit and/or reflect the first radiation beam 208 and the second radiation beam 210, so as to create a combined radiation beam based on at least part of the first radiation beam 208 and the second radiation beam 210. The encoder 200 is able to determine a phase or a change in phase of the combined radiation beam. Based on the phase or the change in phase, the encoder 200 is able to provide a position signal representative of a position of the grating surface 222 relative to the encoder 200.

Instead of the reference grating 202, any type of optical component may be used that is arranged to combine the first radiation beam 208 and the second radiation beam 210. Such an optical component may comprise a diffraction grating and/or a reflective element. The reflective element may comprise a mirror or a corner-cube or any other type of reflective element. The optical component may be arranged to combine the first radiation beam 208 and the second radiation beam 210 by itself or the optical component may be arranged to direct the first radiation beam 208 and the second radiation beam 210 towards another component that is able to combine the first radiation beam 208 and the second radiation beam 210. The scale 220 may be such a component.

There is a first angle 228 between the first radiation beam 208 and the grating surface 222. There is a second angle 230 between the second radiation beam 210 and the grating surface 222. As shown in FIG. 2, there is a difference between the first angle 228 and the second angle 230. The difference may be a difference in the direction of the first angle 228 and the second angle 230, a difference between the amplitudes of the first angle 228 and the second angle 230 or a combination of the direction and the amplitude. Such a difference may occur when a radiation beam, from which the first radiation beam 208 and the second radiation beam 210 are diffracted, is not incident on the grating surface 222 perpendicularly. Due to the difference between the first angle 228 and the second angle 230, the length of the first radiation beam 208 from the grating surface 222 to the reference grating 202 is longer than the length of the second radiation beam 210 from the grating surface 222 to the reference grating 202. To make the optical path length of the first radiation beam 208 equal to the optical path length of the second radiation beam 210, the enclosing device 204 comprises a solid 226. The solid 226 is transparent to the first radiation beam 208 and the second radiation beam 210. The solid 226 is along the second path 214. By selecting a material with a certain refractive index and a size for the solid 226, the solid 226 is arranged to adjust the second optical path length 218. Such a material may be any type of suitable optical glass or optical ceramic.

The first path 212 is at least partly through a first medium. The second path 214 is at least partly through a second medium, in this case the solid 226. The refractive index of the first medium may be different from the refractive index of the second medium. For example, the refractive index of the first medium may be smaller than the refractive index of the second medium.

The first path length 216 is larger than the second path length 218. However, the part of first path 212 that is through the second medium may be smaller than the part of the second path 214 that is through the second medium. For example, no part of the first path 212 is through the second medium.

In an embodiment, the second medium has a larger refractive index than the first medium. The part of the first path 212 through the second medium is smaller than the part of the second path 214 through the second medium. As a result, the optical path length of the second path 214 can be increased, while the optical path length of the first path 212 is not increased or is not increased as much. When increasing the optical path length of the second path 214 relative to the optical path length of the first path 212, the optical design of the encoder 200 may be improved.

It is noted that the receiving surface 206 may be on a body with a certain refractive index and may influence the optical paths of the first radiation beam 208 and the second radiation beam 210. As depicted in FIG. 2, because the first angle 228 is larger than the second angle 230, the first radiation beam 208 propagates over a larger distance through the body than the second radiation beam 210. Since the body typically has a larger refractive index than a gas or ambient air, the body increases the optical path length of the first radiation beam 208 more than the optical path length of the second radiation beam 210. This may be disadvantageous, because the optical path length of the first radiation beam 208 is already larger than that of the second radiation beam 210 due to the difference between the first angle 228 and second angle 230. However, this disadvantage may be at least partly removed by adding the second medium, such as the solid 226.

In the embodiment of FIG. 2, the enclosing device 204 forms a space 232 that encloses the reference grating 202, the first path 212 and the second path 214. The space 232 may be filled with any type of gas or may have no gas. The space 232 may be filled with ambient air. Since the enclosing device 204 encloses the first path 212 and the second path 214, pressure variations outside the encoder 200 are not able to propagate into the first path 212 and the second path 214. The space 232 may be partly defined by the reference grating 202. The reference grating 202 may be in the space 232 and may be surrounded by the space 232.

The encoder 200 may be provided with a conduit 224 that is arranged to connect the space 232 with the ambient environment. The conduit 224 has a restriction for restricting a flow of gas between the space 232 and the ambient environment.

FIG. 2 depicts that the solid 226 is in contact with the reference grating 202. Alternatively, the solid 226 is not in contact with the reference grating 202. The solid 226 may be connected to the body having the receiving surface 206. There may be an intermediate component between the solid 226 and the reference grating 202, such as a protective layer.

Figure 3:
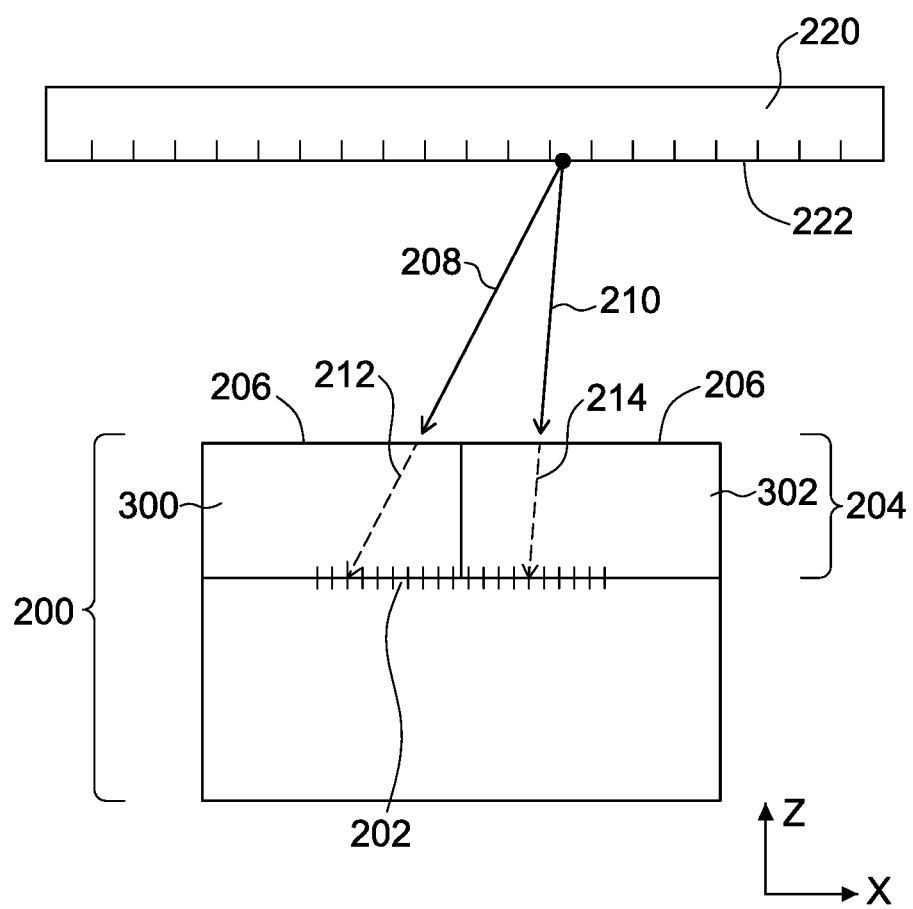
FIG. 3 depicts an encoder according to a second embodiment of the invention

FIG. 3 depicts the encoder 200 according to a second embodiment. The second embodiment may have the same features as disclosed in the previous embodiment, except for what is stated below.

The encoder 200 comprises the enclosing device 204. The enclosing device 204 comprises a first solid 300 and a second solid 302. The first path 212 is going through the first solid 300. The second path 214 is going through the second solid 302. The first solid 300 and the second solid 302 are arranged to cover the reference grating 202. A surface of the first solid 300 and a surface of the second solid 302 together form the receiving surface 206.

The material from which the first solid 300 is made has a different refractive index than the material from which the second solid 302 is made. The difference of the refractive indexes causes a difference in the first optical path length and the second optical path length.

In addition to the first solid 300 and a second solid 302, the enclosing device 204 may comprise more solids. The solids may have different shapes and sizes, or may be made of different types of material.

A combination of the embodiment of FIG. 2 and the embodiment of FIG. 3 may be made. For example, one or both of the first solid 300 and the second solid 302 may be in the space 232.

At least one of the solid 226, solid 300 and solid 302 may comprise a material that is thermally stable. A thermally stable material may be a material that substantially maintains a shape when the temperature of the material changes, such as zerodur. A thermally stable material may have a refractive index that is substantially insensitive to a change in temperature of the material, so a change in temperature does not affect the optical path length through the material.

The receiving surface 206 may be a surface of an optical part that covers the space 232. The receiving surface 206 may be parallel to the grating surface 222. The optical part may comprise a thermally stable material. The receiving surface 206 may comprise a non-transparent portion that is not transparent to the first radiation beam 208 and the second radiation beam 210. The non-transparent portion may be a support frame that has one or more openings. The openings may be filled with transparent material that forms the first surface portion and the second surface portion. The first surface portion and the second surface portion may be in the same plane or may not be in the same plane.

The encoder 200 may have a thermal conducting device. The thermal conducting device may at least partly enclose the first path 212 and the second path 214. The thermal conducting device may be arranged at the outer surface of the encoder 200. The thermal conducting device may be arranged at least partly in the space 232. The thermal conducting device may be arranged to conduct a heat load applied to the encoder 200 from outside of the encoder 200. Such a heat load may be caused by a motor or a sensor located near the encoder 200. By conducting the heat load, the heat load is prevented from reaching the first optical path 212 and the second optical path 214. The thermal conducting device may be arranged to shield the first optical path 212 and the second optical path 214 from the heat load. The heat load may be conducted by the thermal conducting device to a heat sink, or to another part of the encoder 200 where the heat load does not have a negative effect on the performance of the encoder 200. The thermal conducting device may comprise a material with good thermal conducting properties. Such a material may be a metal, such as copper or aluminum, or may be a ceramic such as aluminum-oxide or silicon carbide. The material may comprise cordierite. Thermal conductivity of such a material may be higher than of an optical glass or optical component.

Figure 4:
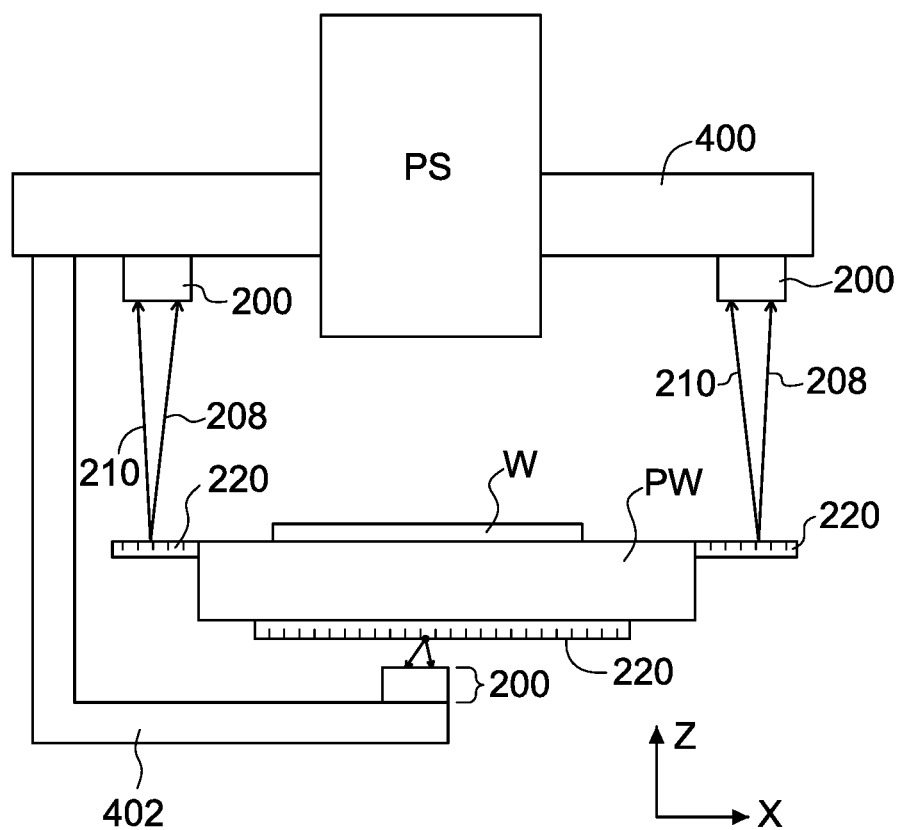
FIG. 4 depicts a lithographic apparatus according to a further embodiment of the invention.

FIG. 4 depicts a lithographic apparatus according to a further embodiment. A substrate W is moved by the stage system PW relative to the projection system PS. An encoder frame 400 holds a plurality of encoders 200. One or more of the encoders 200 may be provided with the enclosing device 204. The stage system PW is provided with a plurality of scales 220 to cooperate with the encoders 200. Each of the encoders 200 receives a first radiation beam 208 and a second radiation beam 210.

The lithographic apparatus may be further provided with an encoder support 402. The encoder support 402 is connected to the encoder frame 400 and holds at least one encoder 200 below the stage system PW. The encoder support 402 may hold the encoder 200 along an optical axis of the projection system PS. The encoder frame 400 may be above the positioning system PW.

The encoder 200 described above may be a 1D-encoder that determines a position of the scale 220 in a single direction. The encoder 200 described above may be a 2D-encoder that determines a position of the scale 220 in two directions, for example in two directions parallel to the grating surface 222 or for example in one direction parallel to the grating surface 222 and in one direction perpendicular to the grating surface 222. The encoder 200 described above may be a 3D-encoder that determines a position of the scale 220 in three directions, for example in two directions parallel to the grating surface 222 and in one direction perpendicular to the grating surface 222.

The grating surface 222 may have a 1D-pattern, e.g., a pattern of parallel lines extending in one direction. The grating surface 222 may have a 2D-pattern, a pattern of a first set of parallel lines extending in one direction and a second set of parallel lines extending in another direction. The two sets of lines may overlap each other and may for example create a so-called checkerboard-pattern.

The encoder 200 may be used in different application as described above. For example, the encoder 200 may be used to determine a position of the patterning device MA relative to the projection system PS. The encoder 200 may be used to determine the position of the encoder frame 400 relative to the projection system PS. The encoder 200 may be used to determine the position of the encoder support 402 relative to the encoder frame 400. Further, the encoder 200 may be used in any other suitable type of stage system. For example, a stage system used to position a work piece in a milling machine, in a robot for handling a substrate W, or a stage system in an inspection tool for inspecting a substrate W.

In the following paragraphs some additional embodiments are described. In a first embodiment, there is provided the encoder 200 comprising an optical component and an enclosing device 204 having a first surface portion and a second surface portion. The first surface portion is arranged to receive from an ambient environment a first radiation beam 208. The second surface portion is arranged to receive from the ambient environment a second radiation beam 210. The optical component is arranged to combine the first radiation beam and the second radiation beam. The enclosing device 204 is arranged to propagate the first radiation beam along a first path 212. The first path 212 is between the first surface portion and the optical component. The enclosing device 204 is arranged to propagate the second radiation beam along a second path 214. The second path 214 is between the second surface portion and the optical component. The enclosing device 204 is arranged to enclose a space 232, so as to isolate the first path 212 and the second path 214 from the ambient environment.

According to the first embodiment, the length of travel of the first radiation beam 208 and the second radiation 210 beam through the ambient environment may be minimized. Disturbances in the ambient environment have a smaller influence on the first radiation beam 208 and the second radiation beam 210, because the first radiation beam 208 and the second radiation beam 210 are partly inside the enclosing device 204.

In a second embodiment, the space 232 is arranged for having a gas. The first path has a first path length through the gas. The second path has a second path length through the gas. The first path length is different from the second path length.

According to the second embodiment, the first path length is different from the second path length. The difference between the first path length and the second path length may be used to achieve a desired optical path length for the first radiation beam and a desired optical path length for the second radiation beam. The difference between the first path length and the second path length does not result in a large measurement error when there is a disturbance in the ambient environment, because first path and the second path are enclosed by the enclosing device.

In a third embodiment, the enclosing device 204 comprises a conduit 224 connecting the space to the ambient environment. The conduit 224 has a restriction for restricting a flow of gas between the space 232 and the ambient environment.

According to the third embodiment, a restricted flow is possible between the space 232 and the ambient environment. The flow is restricted so that it is prevented that high-energy pressure waves enter the space. High-energy pressure waves may have a high amplitude and/or a high frequency. A high amplitude may be 10 Pa or more. A high-frequency may be in the range of 1-10 Hz or more. Such high-energy pressure waves could have disturbed the optical properties of the first radiation beam and the second radiation beam if not restricted by the restriction. The restricted flow allows a pressure between the ambient environment and the space to equalize. In some situations, such as changing weather or transport of the encoder by airplane, a difference in pressure between the ambient environment and the space 232 could occur. When the difference in pressure becomes too big, the enclosing device 204 may be damaged. However, since the conduit is able to equalize the pressure between the ambient environment and the space, such damage may be prevented. The time scale in which the equalization between the space and the ambient environment occurs is long, so the changing ambient environment can be compensated for using known techniques. The time scale may be less than 0.25 Hz.

In a fourth embodiment, the restriction comprises a porous material.

According to the fourth embodiment, a simple and robust restriction can be made by using porous material.

In a fifth embodiment, the first path is at least partly through a first medium. The second path is at least partly through a second medium. A refractive index of the first medium is different from a refractive index of the second medium.

According to the fifth embodiment, by using the first medium and the second medium, each having a different refractive index, each of the optical path length of the first radiation beam and the optical path length of the second radiation beam can be set as desired.

In a sixth embodiment, one of the first medium and the second medium comprises a solid.

According to the sixth embodiment, the solid may provide a simple and robust way to achieve a desired optical path length.

In a seventh embodiment, the enclosing device comprises a thermal conducting device. The thermal conducting device at least partly encloses the first path and the second path.

According to the seventh embodiment, the thermal conducting device may be able to remove a thermal gradient around the first path and the second path. By removing the thermal gradient, the encoder becomes less sensitive to heat loads, for example a heat load caused by dissipators near the encoder, such as motors.

In an eighth embodiment, the optical component comprises a grating 202 for diffracting at least one of the first radiation beam and the second radiation beam.

According to the eighth embodiment, by diffracting of at least one of the first radiation beam and the second radiation beam, the first radiation beam and the second radiation beam can be directed such that the first radiation beam and the second radiation beam can be combined into a single radiation beam. The phase information of the single radiation beam may be used to determine the position of the encoder relative to the grating surface.

In a ninth embodiment, the enclosing device is arranged to isolate the first path and the second path from a change in a refractive index of the ambient environment.

According to the ninth embodiment, the first radiation beam and the second radiation beam may be substantially not affected by a change in a refractive index of the ambient environment along respectively the first path and the second path. As a result, a change in temperature or a change in pressure in the ambient environment has a smaller effect on the measurement error of the encoder.

In a tenth embodiment, there is provided a position measurement system comprising the encoder according to the previous embodiments and a grating surface 222. The grating surface 222 is arranged to diffract a radiation beam so as to create the first radiation beam and the second radiation beam.

According to the tenth embodiment, the position measurement system may be able to determine the position of the encoder relative to the grating surface more accurately.

In an eleventh embodiment, the first surface portion is arranged to receive the first radiation beam at a first angle relative to the grating surface. The second surface portion is arranged to receive the second radiation beam at a second angle relative to the grating surface. The first angle is different from the second angle.

According to the eleventh embodiment, since the first angle is different from the second angle, the path length of the first radiation beam through the ambient environment is different from the path length of the second radiation beam through the ambient environment. In such a situation, the encoder according to the previously mentioned embodiments is suited to reduce the measurement error caused by disturbances in the ambient environment, because the sensitivity of each of the first radiation beam and the second radiation beam to the disturbances is made more equal.

In a twelfth embodiment, the optical component comprises a reflective element arranged to reflect the first radiation beam and the second radiation beam back to the grating surface. The grating surface is arranged to diffract the first radiation beam and the second radiation beam reflected by the reflective element into a single radiation beam.

According to the twelfth embodiment, the position measurement system may be able to determine the position of the encoder relative to the grating surface more accurately.

In a thirteenth embodiment, there is provided a lithographic apparatus comprising the position measurement system of one of previously mentioned embodiments.

According to the thirteenth embodiment, the lithographic apparatus may be able to expose the pattern onto the substrate with more accuracy.

In a fourteenth embodiment, the lithographic apparatus comprises a projection system, a first stage system, a second stage system and a control system. The projection system is to project a patterned radiation beam onto a substrate. The first stage system is for holding a patterning device arranged to create a pattern in the patterned radiation beam. The second stage system is for holding the substrate. The control system is to control a position of at least one of the first stage system and the second stage system. The position measurement system is arranged provide a signal to the control system representative of a position of the least one of the first stage system and the second stage system.

According to the fourteenth embodiment, the lithographic apparatus may be able to determine the position of the at least one of the first stage system and the second stage system with more accuracy. As a result, the pattern can be projected onto the substrate with more accuracy.

In an embodiment, there is provided an encoder comprising: an optical component; an enclosing device having a receiving surface, a first medium and a second medium, wherein the receiving surface is arranged to receive from an ambient environment a first radiation beam and a second radiation beam, wherein the optical component is arranged to combine the first radiation beam and the second radiation beam, wherein the enclosing device is arranged to propagate the first radiation beam along a first path and the second radiation beam along a second path, wherein the first path and the second path are from the receiving surface to the optical component, wherein the enclosing device is arranged to isolate the first path and the second path from the ambient environment, wherein the first path is at least partly through the first medium, wherein the second path is at least partly through the second medium, wherein a path length of the first path through the second medium is different from a path length of the second path through the second medium.

In an embodiment, a refractive index of the first medium is smaller than a refractive index of the second medium. In an embodiment, the first path has a first path length, wherein the second path has a second path length, wherein the first path length is larger than the second path length, wherein the path length of the first path through the second medium is smaller than the path length of the second path through the second medium. In an embodiment, the enclosing device is arranged to enclose a space arranged for having a gas, wherein the gas forms the first medium. In an embodiment, the enclosing device comprises a conduit connecting the space to the ambient environment, wherein the conduit has a restriction for restricting a flow of gas between the space and the ambient environment. In an embodiment, the restriction comprises a porous material. In an embodiment, at least one of the first medium and the second medium comprises a solid. In an embodiment, the enclosing device comprises a thermal conducting device, wherein the thermal conducting device at least partly encloses the first path and the second path. In an embodiment, the optical component comprises a grating for diffracting at least one of the first radiation beam and the second radiation beam. In an embodiment, the enclosing device is arranged to isolate the first path and the second path from a change in a refractive index of the ambient environment.

In an embodiment, there is provided a position measurement system, comprising an encoder as described herein and a grating surface, wherein the grating surface is arranged to diffract a radiation beam so as to create the first radiation beam and the second radiation beam.

In an embodiment, the receiving surface is arranged to receive the first radiation beam at a first angle, wherein the receiving surface is arranged to receive the second radiation beam at a second angle, wherein the first angle is different from the second angle. In an embodiment, the optical component comprises a reflective element arranged to reflect the first radiation beam and the second radiation beam back to the grating surface, wherein the grating surface is arranged to diffract the first radiation beam and the second radiation beam reflected by the reflective element into a single radiation beam.

In an embodiment, there is provided a lithographic apparatus, comprising a position measurement system as described herein. In an embodiment, the lithographic apparatus comprises: a projection system to project a patterned radiation beam onto a substrate; a first stage system for holding a patterning device arranged to create a pattern in the patterned radiation beam; a second stage system for holding the substrate; a control system to control a position of at least one of the first stage system and the second stage system, wherein the position measurement system is arranged provide to the control system a signal representative of a position of the least one of the first stage system and the second stage system.

Although specific reference may be made in this text to the use of a lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The substrate W may be processed, before or after the transfer of the pattern onto the substrate W, in for example a track, a metrology tool and/or an inspection tool. A track is a tool that typically applies a layer of resist to a substrate W and develops the resist that has been exposed to the radiation beam B. Further, the substrate W may be processed more than once, for example in order to create a multi-layer IC, so that the term substrate W used herein may also refer to a substrate W that already contains multiple processed layers.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. An encoder comprising:
   an optical component;
   an enclosing device having a receiving surface, wherein the receiving surface is arranged to receive from an ambient environment a first radiation beam of diffracted radiation and a second radiation beam of diffracted radiation and arranged to receive the first and second radiation beam from a scale that diffracts radiation to produce the diffracted radiation of the first radiation beam and the diffracted radiation of the second radiation beam; and
   a sensor configured to generate a position signal based on combined diffracted radiation of the first and second radiation beams,
   wherein the optical component is arranged to combine the first radiation beam and the second radiation beam,
   wherein the enclosing device is arranged to propagate the first radiation beam along a first path and the second radiation beam along a second path,
   wherein the first path and the second path are from the receiving surface to the optical component,
   wherein the first and second paths are within the enclosing device,
   wherein the first path is at least partly through a first medium,
   wherein the second path is at least partly through a second medium of a different chemical composition than the first medium in order to equalize a total optical path length of the second radiation beam with a total optical path length of the first radiation beam, the total optical path length of the first radiation beam and the total optical path length of the second radiation beam are the respective path lengths from at least the scale to at least the optical component, and
   wherein a path length, if any, of the first path through the second medium is different from a path length of the second path through the second medium.

2. The encoder of claim 1, wherein a refractive index of the first medium is smaller than a refractive index of the second medium.

3. The encoder of claim 1, wherein the first path has a first path length, wherein the second path has a second path length, wherein the first path length is larger than the second path length, wherein the path length, if any, of the first path through the second medium is smaller than the path length of the second path through the second medium.

4. The encoder of claim 1, wherein the enclosing device is arranged to enclose a space arranged to have a gas, wherein the gas forms the first medium.

5. The encoder of claim 4, wherein the enclosing device comprises a conduit connecting the space to the ambient environment, wherein the conduit has a restriction configured to restrict a flow of gas between the space and the ambient environment.

6. The encoder of claim 5, wherein the restriction comprises a porous material.

7. The encoder of claim 1, wherein the first medium, or the second medium, or both the first and second mediums, comprise a solid.

8. The encoder of claim 1, wherein the enclosing device comprises a thermal conducting device, wherein the thermal conducting device at least partly encloses the first path and the second path.

9. The encoder of claim 1, wherein the optical component comprises a grating configured to diffract the first radiation beam, or the second radiation beam, or both the first and second radiation beams.

10. The encoder of claim 1, wherein the enclosing device is arranged to effectively isolate the first path and the second path from a change in a refractive index of the ambient environment.

11. A position measurement system, comprising an encoder according to claim 1 and a grating surface, wherein the grating surface is arranged to diffract a radiation beam so as to create the first radiation beam and the second radiation beam.

12. The position measurement system of claim 11, wherein the receiving surface is arranged to receive the first radiation beam at a first angle, wherein the receiving surface is arranged to receive the second radiation beam at a second angle, wherein the first angle is different from the second angle.

13. The position measurement system of claim 11, wherein the optical component comprises a reflective element arranged to reflect the first radiation beam and the second radiation beam back to the grating surface, wherein the grating surface is arranged to diffract the first radiation beam and the second radiation beam reflected by the reflective element into a single radiation beam.

14. A lithographic apparatus, comprising a substrate table configured to hold a substrate, a support table configured to hold a patterning device, the patterning device configured to provide a pattern to the substrate, and the position measurement system of claim 11.

15. The lithographic apparatus of claim 14, comprising:
a projection system to project a patterned radiation beam onto a substrate;
a first stage system configured to hold a patterning device arranged to create a pattern in the patterned radiation beam;
a second stage system configured to hold the substrate;
a control system to control a position of the first stage system, or the second stage system, or both the first and second stage system, wherein the position measurement system is arranged provide to the control system a signal representative of a position of the respective first stage system and/or second stage system.

16. An encoder comprising:
an optical component arranged to combine a first radiation beam of diffracted radiation and a second radiation beam of diffracted radiation;
an enclosing device having a receiving surface arranged to receive, from an ambient environment, the first radiation beam and the second radiation beam and arranged to receive the first and second radiation beam from a scale that diffracts radiation to produce the diffracted radiation of the first radiation beam and the diffracted radiation of the second radiation beam; and
a sensor configured to generate a position signal based on combined diffracted radiation of the first and second radiation beams,
wherein the enclosing device is arranged such the first radiation beam propagates along a first path from the receiving surface to the optical component and the second radiation beam propagates along a second path from the receiving surface to the optical component and the first and second paths are located within the enclosing device,
wherein a path length of the first path from the receiving surface to the optical component is different from a path length of the second path from the receiving surface to the optical component, wherein at least part of the first path, of the second path, or of both the first and second paths, passes through a solid, and
wherein a total optical path length of the first radiation beam is equalized with a total optical path length of the second radiation beam so as to reduce or minimize any negative effect of fluctuations of a radiation source providing the first radiation beam and the second radiation beam, the total optical path length of the first radiation beam and the total optical path length of the second radiation beam are the respective path lengths from at least the scale to at least the optical component.

17. The encoder of claim 16, wherein the first path passes through a first medium but not a second different medium and the second path passes through the second different medium.

18. The encoder of claim 17, wherein a refractive index of the first medium is smaller than a refractive index of the second medium.

19. The encoder of claim 17, wherein the enclosing device is arranged to enclose a space arranged to have a gas, wherein the gas forms the first medium.

20. The encoder of claim 17, wherein the first medium, or the second medium, or both the first and second mediums, comprise a solid.

21. A position measurement system, comprising:
a grating surface arranged to diffract a radiation beam so as to create a first radiation beam and a second radiation beam;
an optical component;
an enclosing device having a receiving surface, wherein the receiving surface is arranged to receive from an ambient environment a first radiation beam and a second radiation beam,
wherein the optical component is arranged to combine the first radiation beam and the second radiation beam,
wherein the enclosing device is arranged to propagate the first radiation beam along a first path and the second radiation beam along a second path, wherein the first path and the second path are from the receiving surface to the optical component, wherein the enclosing device is arranged to isolate the first path and the second path from the ambient environment, wherein the first path is at least partly through a first medium, wherein the second path is at least partly through a second medium, wherein a path length of the first path through the second medium is different from a path length of the second path through the second medium, so as to make a total optical path length of the first radiation beam and a total optical path length of the second radiation beam substantially equal to each other, wherein the optical component comprises a reflective element arranged to reflect the first radiation beam and the second radiation beam back to the grating surface, and wherein the grating surface is arranged to diffract the first radiation beam and the second radiation beam reflected by the reflective element into a single radiation beam.

* * * * *